United States Patent
Murata

(10) Patent No.: US 6,884,989 B2
(45) Date of Patent: Apr. 26, 2005

(54) OVERHEAD-TRAVELING CARRYING APPARATUS

(75) Inventor: Masanao Murata, Ise (JP)

(73) Assignee: Shinko Electric Co., Ltd., Tokyo (JP)

( * ) Notice: Subject to any disclaimer, the term of this patent is extended or adjusted under 35 U.S.C. 154(b) by 81 days.

(21) Appl. No.: 10/225,141

(22) Filed: Aug. 22, 2002

(65) Prior Publication Data

US 2003/0001118 A1 Jan. 2, 2003

Related U.S. Application Data

(63) Continuation of application No. 09/451,700, filed on Dec. 1, 1999, now Pat. No. 6,504,144.

(30) Foreign Application Priority Data

Dec. 2, 1998 (JP) .......................................... 10-343472
Apr. 13, 1999 (JP) .......................................... 11-105915

(51) Int. Cl.⁷ ............................ G01N 9/04; G06M 7/00
(52) U.S. Cl. ....................... 250/221; 250/224; 340/555; 340/673
(58) Field of Search ............................. 250/221, 222.1, 250/223 R, 224; 340/555, 556, 673, 676

(56) References Cited

U.S. PATENT DOCUMENTS

| | | |
|---|---|---|
| 4,147,930 A | 4/1979 | Browne et al. |
| 4,281,342 A | 7/1981 | Ueda et al. |
| 5,136,155 A | 8/1992 | Kyburz et al. |
| 5,323,513 A | 6/1994 | Binder et al. |
| 6,080,046 A | 6/2000 | Shendon et al. |
| 6,092,678 A | 7/2000 | Kawano et al. |
| 6,182,843 B1 | 2/2001 | Tax et al. |
| 6,504,144 B1 * | 1/2003 | Murata ...................... 250/224 |

FOREIGN PATENT DOCUMENTS

| | | |
|---|---|---|
| JP | 61-254496 | 11/1986 |
| JP | 3-162395 | 7/1991 |
| JP | 4-116093 | 4/1992 |
| JP | 10-45213 | 2/1998 |
| JP | 10-167463 | 6/1998 |
| JP | 10-167663 | 6/1998 |

* cited by examiner

Primary Examiner—Kevin Pyo
(74) Attorney, Agent, or Firm—Nixon & Vanderhye P.C.

(57) ABSTRACT

This invention has as an object thereof to provide an overhead-traveling carrying apparatus which is capable of inexpensively incorporating countermeasures for detecting the presence of an obstacle such as a human being or a carelessly placed object during the lowering of an object to be carried onto the load port of a semiconductor manufacturing device prior to the contact of the obstacle with the object to be carried, thereby avoiding such contact. A structure is adopted in which obstacle detecting sensors which scan the raising and lowering path between a carriage and the load port of each semiconductor manufacturing apparatus, and which detect the presence of obstacles, are provided on the carriage with attached hoist.

1 Claim, 8 Drawing Sheets

US 6,884,989 B2

OVERHEAD-TRAVELING CARRYING APPARATUS

This application is a continuation of application Ser. No. 09/451,700, filed Dec. 1, 1999, now U.S. Pat. No. 6,504,144, the entire content of which is hereby incorporated by reference in this application.

BACKGROUND OF THE INVENTION

1. Field of the Invention

The present invention relates to an overhead-traveling carrying apparatus which travels along a track which is installed overhead, and which conveys objects to be carried in a suspended state between semiconductor manufacturing apparatuses which are disposed in a clean room.

2. Background Art

In production facilities which conduct the manufacturing of semiconductor devices, carrying devices are employed which automatically conduct the conveyance of semiconductor wafers among a variety of apparatuses; track-type carrying apparatuses are often employed as such carrying apparatuses. In general, in track-type carrying apparatuses, the structure is such that carriages travel along tracks which are installed either overhead or on the floor surface, and normally the semiconductor wafer processes are conducted to the side of the tracks.

Generally, semiconductor devices are produced via processing involving several hundred processes in which a semiconductor wafer comprising silicon or the like is conveyed back and forth between a variety of semiconductor manufacturing apparatuses (wafer processing apparatuses, storage apparatuses, work platforms, buffer apparatuses, and the like) by an overhead-traveling carrying apparatus or the like.

This will be explained below with reference to FIG. 6. For example, in an overhead-traveling carrying apparatus for semiconductor manufacturing apparatuses in a clean room, carriages 3 with attached hoists, which travel along an overhead track 1 which is not depicted, are employed, and processing is conducted by carrying wafer carriers 6 with semiconductor wafers 2 loaded thereon between the semiconductor manufacturing apparatuses 7, or between the semiconductor manufacturing apparatuses 7 and the stocker 7A.

The carriages 3 with attached hoists depicted in the figure comprise a traveling part 3a, which travels along track 1, and a hand 5, which is suspended in such a manner as to be fully raised or lowered by a hand suspending part 4 which is provided on this traveling part 3a; the wafer carrier 6, which is placed at the load port 8 of the semiconductor manufacturing apparatus 7, is grasped by hand 5, and after the hand suspending part 4 lifts the hand 5, this is carried along the track 1 by traveling part 3a.

Within this clean room, as shown in the figure, a plurality of semiconductor manufacturing apparatuses 7 are arranged in a parallel fashion along the track 1 which is provided overhead, and the wafer carriers 6 are grasped on load port 8 of each semiconductor manufacturing apparatus 7 by the plurality of carriages 3 with attached hoists, and are carried to other semiconductor manufacturing apparatuses 7.

The carrying of the semiconductor wafers 2 by the overhead-traveling carrying apparatus described above is conducted in the following manner. First, the carriage 3 with an attached hoist travels along track 1, and stops above a load port 8 which has a wafer carrier 6 which is to be carried. Next, the hand suspending part 4 is lowered and the hand 5 descends, and the wafer carrier 6 is held by the hand 5. Then, the hand suspending part 4 is hoisted and the wafer carrier 6 is removed from load port 8, and after this has been hoisted to a maximum height, the carriage 3 with an attached hoist again begins to travel.

Next, the carriage is again stopped above the load port 8 of a stocker 7A or another semiconductor manufacturing apparatus 7 which is to conduct the subsequent process. The hand suspending part 4 is then lowered and the hand 5 descends, and after the wafer carrier 6 has come completely to rest on the load port 8, the hand 5 releases the wafer carrier 6 and the hand suspending part 4 is again hoisted, lifting hand 5, and a transition is effected to the next carrying operation.

In such overhead-traveling carrying apparatuses, in order to avoid problems such as the dropping of objects to be carried or contact between objects to be carried and obstacles (not depicted in the figure) such as humans or objects which were not placed carefully, during the lowering of the objects to be carried, a variety of countermeasures thereto have been considered from the point of view of the raising and lowering relationship between the objects to be carried by wafer carriers 6 and the load ports 8.

A conventional proposal for such countermeasures will be discussed below with reference to FIGS. 7 through 10. This countermeasure proposal was announced as a joint guidance of J300 (Japan 300 mm Semiconductor Technology Conference) and I300I (International 300 mm Initiative). Those structural parts which are identical to those explained by FIG. 6 are given identical reference numbers, and an explanation thereof will be omitted.

FIG. 7 shows a case in which an emergency stoppage switch 9 is provided in the vicinity of a semiconductor manufacturing apparatus 7 (in the figure, this is provided on the upper surface of load port 8), and prior to the occurrence of a problem, or after a problem has occurred, an operator not depicted in the figure presses this switch, and thereby stops the raising or lowering operation of the hand 5 or the wafer carrier 6. For the purposes of the explanation, these proposals will hereinafter be referred to as countermeasure proposal A.

FIG. 8 shows a case in which a light curtain 10 is placed in front of load port 8 using optical sensors, and when this light curtain 10 is disrupted by an obstacle such as a person or the like, the semiconductor manufacturing apparatus 7 detects the abnormality and stops the raising or lowering operation of the wafer carrier 6. For the purposes of explanation, this proposal will hereinafter be referred to as countermeasure proposal B.

FIG. 9 shows the case in which walls 11 and manual doors 12 are provided above load port 8, and the space above load port 8 is thus covered. When it is necessary to gain access to the area within load port 8 for the purposes of maintenance or the like, the manual doors 12 may be opened manually; a sensor 13 which detects this open state is provided in manual doors 12, and in the state in which manual doors 12 are opened, the sensor 13 detects this and halts the raising or lowering operation of the wafer carrier 6. For the purposes of explanation, this proposal will be referred to as countermeasure proposal C.

FIG. 10 shows the case in which, in place of the manual doors in countermeasure proposal C, automatic doors 14 which open and close automatically are provided. In this proposal, as well, sensors 13 are provided in the same manner as in countermeasure proposal C. For the purposes of explanation, this proposal will be referred to hereinbelow as countermeasure proposal D.

However, these conventional countermeasure proposals A, B, C, and D have the following problems, and have not reached practical application.

In other words, countermeasure proposal A requires the observation of all of a large number semiconductor manufacturing apparatuses 7 by operators, and requires instantaneous decisions by those operators, so that it is not appropriate for continuous employment.

Furthermore, countermeasure proposals B, C, and D all require the constructing of countermeasures at more than 1,000 spots in order to be applied to all of the load ports 8 (generally, there are 2 to 4 of these for each apparatus) of a large number of semiconductor manufacturing apparatuses 7 (normally, between 300 and 400; furthermore, there are several tens of the carriages 3 with attached hoists in this case), so that this causes problems in that the manufacturing costs or maintenance costs of the semiconductor manufacturing apparatuses 7 increase.

SUMMARY OF THE INVENTION

The present invention was created in light of the above circumstances; the objects thereof are given below. In other words, it is an object of the present invention to provide an overhead-traveling carrying apparatus which is capable of cheaply implementing countermeasures which detect the contact between objects to be carried and obstacles such as persons and objects which are not carefully placed, during the lowering of the objects to be carried, and avoiding this contact.

The overhead-traveling carrying apparatus of the present invention adapts the following mechanisms in order to solve the problems described above.

In other words, the overhead-traveling carrying apparatus of the present invention is an overhead-traveling carrying apparatus provided with a track, which is installed overhead, and carriages with attached hoists, which travel along the track, wherein the carriages with attached hoists are provided with obstacle detecting sensors for detecting the presence of obstacles by optically searching the raising and lowering path between a carriage and a load port of each manufacturing apparatus.

In accordance with this overhead-traveling carrying apparatus, by means of the obstacle detecting sensor, the presence of obstacles between a carriage with an attached hoist and a load port may be observed, and when an obstacle is detected, the lowering operation of an object to be carried may be halted prior to any interference between the obstacle and the object to be carried. A number of these obstacle detecting sensors which is smaller than that of the manufacturing apparatuses may be installed on the side of the carriages with attached hoists, and thereby, the number of devices required can be reduced.

In the overhead-traveling carrying apparatus in accordance with other aspect of the present invention, the range of the optical search may be varied in accordance with the height of the load port of the manufacturing apparatus.

In accordance with this apparatus, the range of the optical search may be set in advance in accordance with the height from the floor of the load ports of the various manufacturing apparatuses, and thereby, it is possible to accommodate manufacturing apparatuses having load ports with differing heights.

In the overhead-traveling carrying apparatus in accordance with another aspect of the present invention, the obstacle detecting sensor is a regression reflection type which shines light onto a prespecified detection area on a reflector plate provided on the load port or on the floor surface adjoining the manufacturing apparatus on the load port side which is regarded as a plane and which collects light reflected from the detection area, and a control mechanism is provided which, when the obstacle detecting sensor collects light reflected from the total surface of the detection area, makes a determination that it is possible to move the carrier of the carriage with attached hoist, and when light reflected from the total surface of the detection area is not obtained, makes a determination that it is not possible to move the carrier.

In accordance with this apparatus, by means of the obstacle detecting sensor and the control mechanism, the presence of obstacles between the carriage with attached hoist and the load port can be observed, and when an obstacle is detected, it is possible to stop the lowering operation of the object to be carried prior to interference between the object to be carried and the obstacle.

The overhead-traveling carrying apparatus according to another aspect of the present invention, the regression reflection type obstacle detecting sensors are installed at the carriages with attached hoists in a row in the horizontal direction.

In accordance with this apparatus, a broad planar observation range is formed between the carriage having the attached hoist and the load port, by means of the sum of the observation areas of each regression reflection type obstacle detecting sensor. Therein, the presence of obstacles is observed, and when an obstacle has been detected, the lowering operation of the object to be carried is stopped before any interference between the obstacle and the object to be carried.

BRIEF DESCRIPTION OF THE DIAGRAMS

DETAILED DESCRIPTION OF THE PREFERRED EMBODIMENTS

Figure 1:
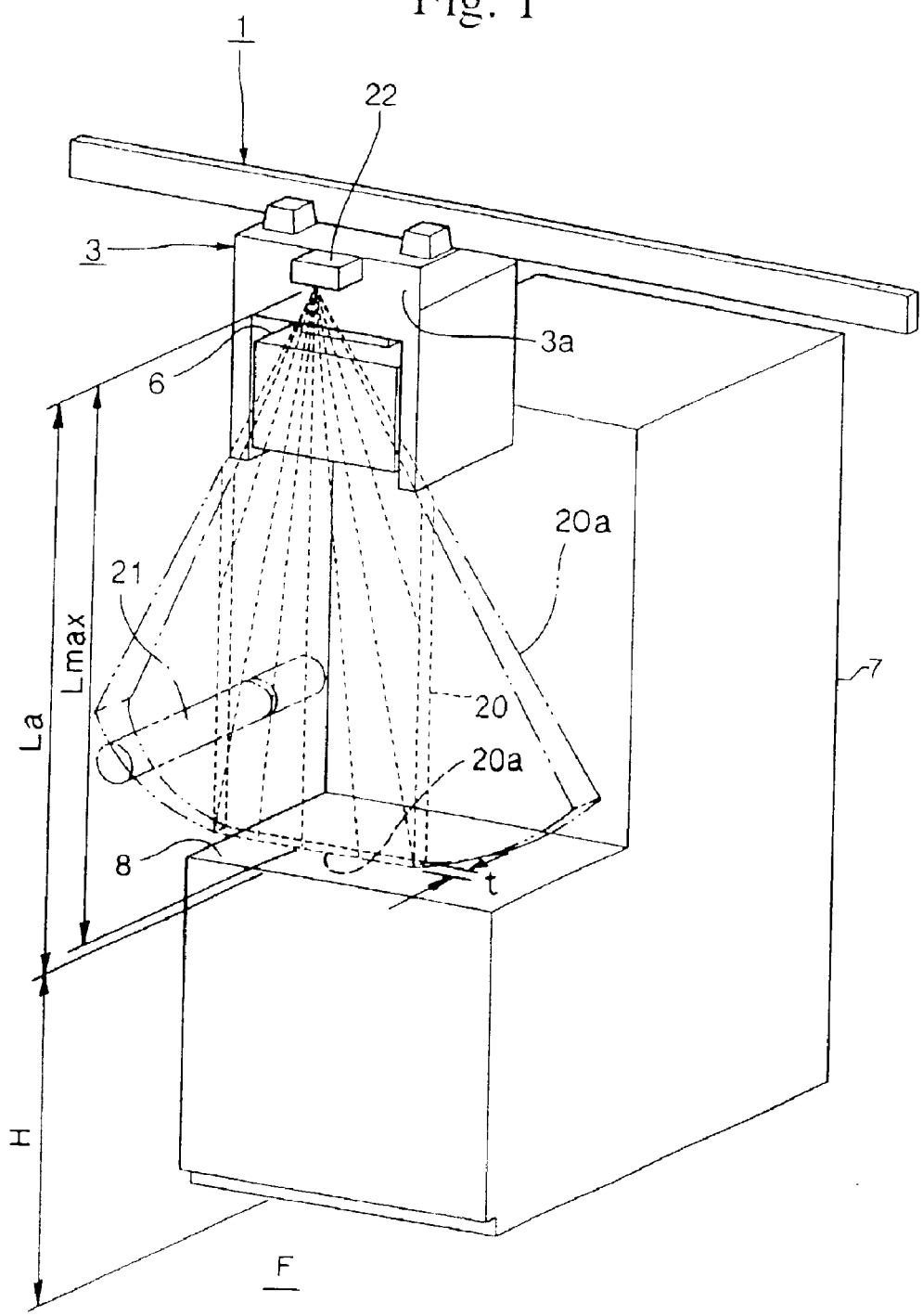
FIG. 1 is a perspective view showing a first embodiment of the overhead-traveling carrying apparatus of the present invention.
Figure 6:
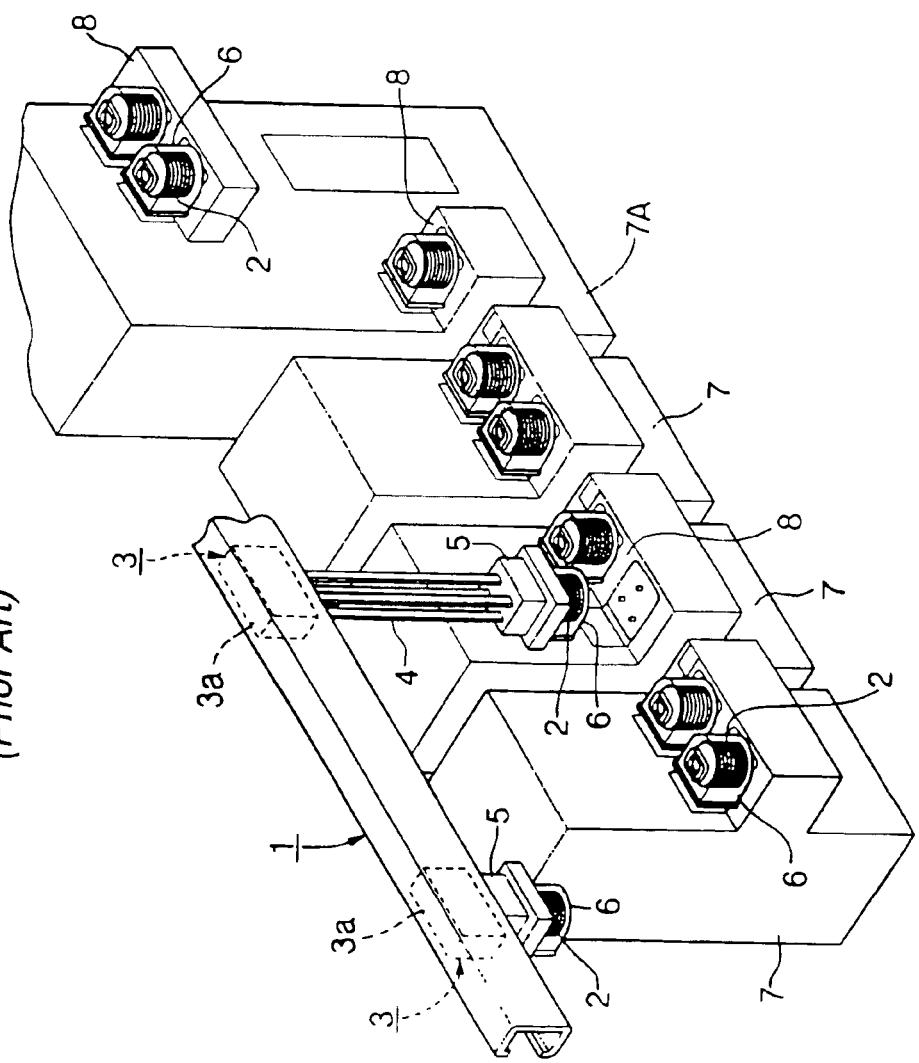
FIG. 6 is a perspective view showing a conventional overhead-traveling carrying apparatus.
Figure 7:
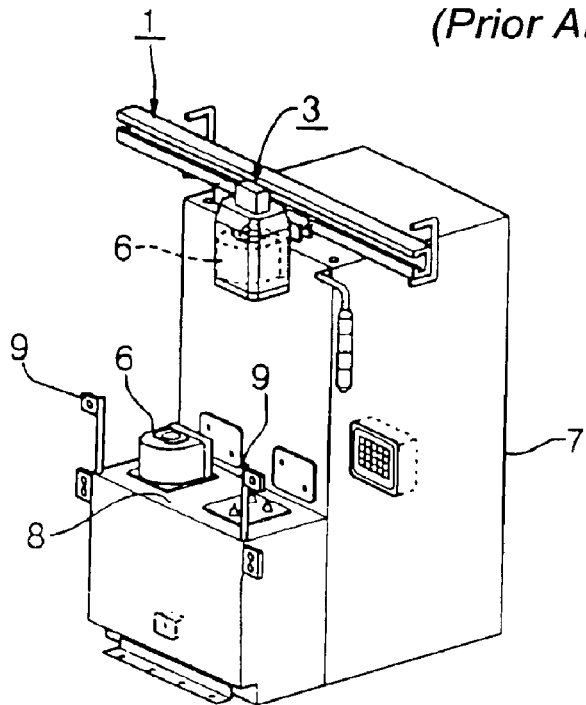
FIG. 7 is a perspective view showing another conventional overhead-traveling carrying apparatus.
Figure 8:
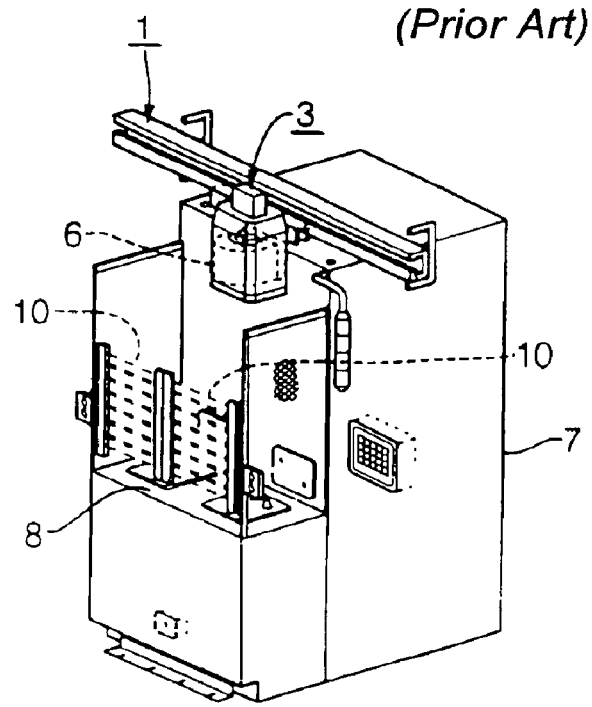
FIG. 8 is a perspective view showing another conventional overhead-traveling carrying apparatus.
Figure 9:
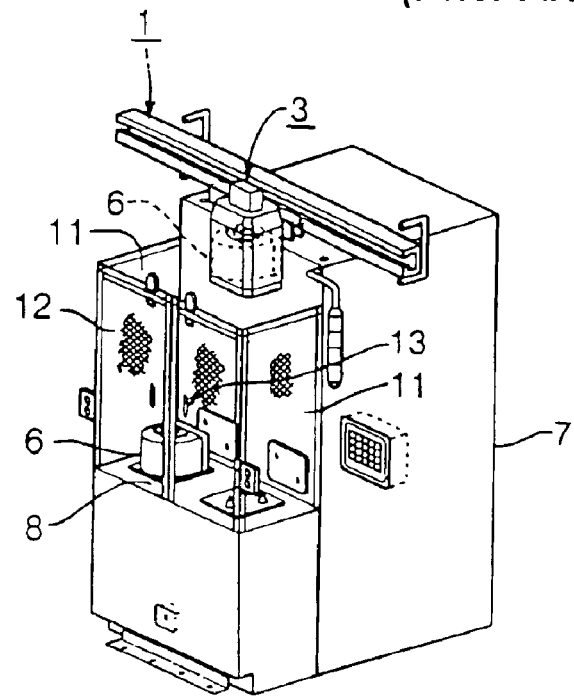
FIG. 9 is a perspective view showing another conventional overhead-traveling carrying apparatus.
Figure 10:
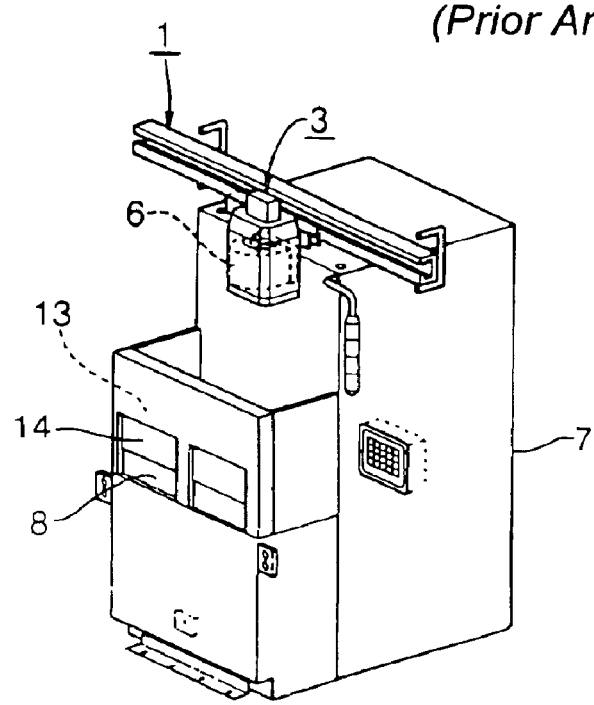
FIG. 10 is a perspective view showing another conventional overhead-traveling carrying apparatus.

The first embodiment of the present invention will be explained hereinbelow with reference to FIG. 1. Structural parts which are identical to those of FIG. 6, which depicts conventional technology, are given identical reference numbers, and an explanation thereof will be omitted here.

In the overhead-traveling carrying apparatus of the present invention, in an overhead-traveling carrying apparatus which is provided with a track 1, which is installed overhead, and carriages 3 with attached hoists, which travel along track 1, an obstacle detecting sensor 22 is provided which optically searches the raising and lowering path between a carriage 3 and the load port 8 of each semiconductor manufacturing apparatus 7 when the carriage 3 with attached hoist lowers a wafer carrier 6 onto the load port 8 of the semiconductor manufacturing apparatus 7, and detects the presence of an obstacle 21; this is the chief point of difference from the conventional technology, and thus the explanation will center thereon.

This obstacle detecting sensor 22 is an optical-type range-finding sensor in which a light emitting part and a light collecting part which are not depicted in the figure are incorporated, and it measures the distance between the sensor 22 and the detected object by means of trigonometrical survey. The obstacle detecting sensor 22 may be other type of a range-finding sensor, such as a sensor measuring the distance by calculating the reflex time of light or a sensor using coherent light. The obstacle detecting sensor 22 is supported by a yawing mechanism (not shown), and it scans a fan shaped scan range 20a centering on the obstacle detecting sensor 22. The obstacle detecting sensor 22 is connected to a computing unit (not shown), and the computing unit performs calculation for dividing the scan range 20a using two virtual planes which are parallel in the perpendicular direction to form an observation range 20 and incorporates data within this observation range 20 into memory, while excluding data outside this range.

By means of such an arrangement, an approximately pentagonal layer of light formed between the obstacle detecting sensor 22 and load port 8 is formed as an observation range 20. The reason for forming the observation range 20 in this way and the reason for providing the obstacle detecting sensor 22 at the side wall 3a are that by providing the observation field 20 in a selective manner at the front side, which is most likely to come into proximity with an obstacle 21 within the range of movement of wafer carrier 6, it is possible to efficiently conduct the observation. Furthermore, the width t of the observation range 20 is determined by the path of the light rays from the light emitting part, so that if a laser beam is employed, it is possible to make this width extremely narrow.

Furthermore, the observation range 20 may be varied in accordance with the height of the load port 8 of each semiconductor manufacturing apparatus 7. That is to say, the maximum length Lmax in the perpendicular direction of the observation range 20, which is the range in which the obstacle detecting sensor 22 conducts detection, varies by semiconductor manufacturing apparatus 7 in accordance with the length La in the perpendicular direction from the obstacle detecting sensor 22 to the upper surface of each load port 8, and this may be adopted to any semiconductor manufacturing apparatus 7.

When the wafer carrier 6 is lowered by the overhead-traveling carrying apparatus of the present invention described above, the presence of obstacles 21 within the observation range 20 is observed by obstacle detecting censor 22 in a non-contacting manner, and when an obstacle 21 is discovered, the lowering operation of the wafer carrier 6 is halted before there is interference between the obstacle 21 and the wafer carrier 6. The number of obstacle detecting sensors 22 provided at the side of carriages 3 with attached hoists is smaller than that of the semiconductor manufacturing apparatuses 7, so that it is possible to reduce the numbers thereof required.

Accordingly, in accordance with the overhead-traveling carrying apparatus of the present embodiment, by providing a number of obstacle detecting sensors 22 at the side of carriages 3 with attached hoists which is far smaller than the number of semiconductor manufacturing apparatuses 7, it is possible to provide an overhead-traveling carrying apparatus in which inexpensively incorporates countermeasures for detecting obstacles 21 such as people or objects placed in a careless manner prior to contact of wafer carrier 6 with these obstacles during the lowering thereof, and thus avoiding such contact.

Furthermore, by employing optical sensors as the obstacle detecting sensors 22, the confirmation of the presence of obstacles 21 can be conducted in a non-contacting manner, and it becomes possible to produce an overhead-traveling carrying apparatus which conducts observations without damaging the obstacles 21.

Furthermore, in the setting of the observation range 20, by conducting this setting so that the maximum length Lmax in the perpendicular direction in the observation range 20 is in agreement with the length La in the perpendicular direction between the load port 8 of each semiconductor manufacturing apparatus 7 and the obstacle detecting sensor 22, it is possible to provide an overhead-traveling carrying apparatus which may be adopted to all semiconductor manufacturing apparatuses 7 having load ports 8 in which the height H thereof from the floor surface F differs.

Figure 2:
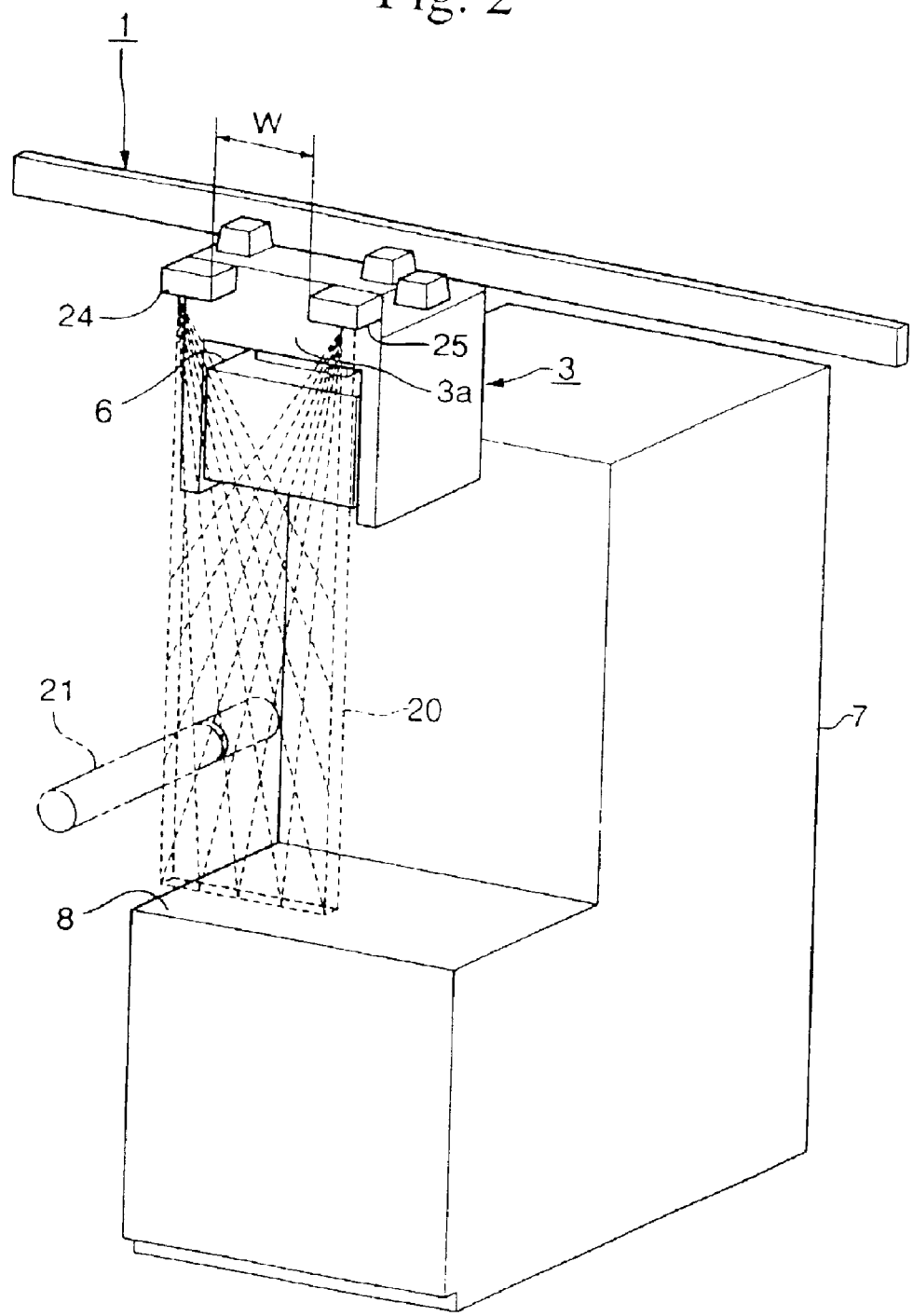
FIG. 2 is a perspective view showing a second embodiment of the overhead-traveling carrying apparatus of the present invention.

Next, a second embodiment of the present invention will be explain with reference to FIG. 2. Those structural parts which are identical to those of FIG. 1, which depicted the first embodiment, are given identical reference numbers, and an explanation thereof will be omitted here.

In this embodiment, in place of the single obstacle detecting sensor 22 in the first embodiment, a pair of scanning-type obstacle detecting sensors 24 and 25 are provided at the side wall 3a with a fixed gap W therebetween. Sensors 24 and 25 are electro-optical sensors for detecting obstacles which have a net-shaped detection area by means of scanning beams and positional detection elements (PSD), and conduct detection by means of optical trigonometric distance detection.

In this embodiment, as well, it is possible to obtain operating effects which are identical to those of the first embodiment.

Figure 3:
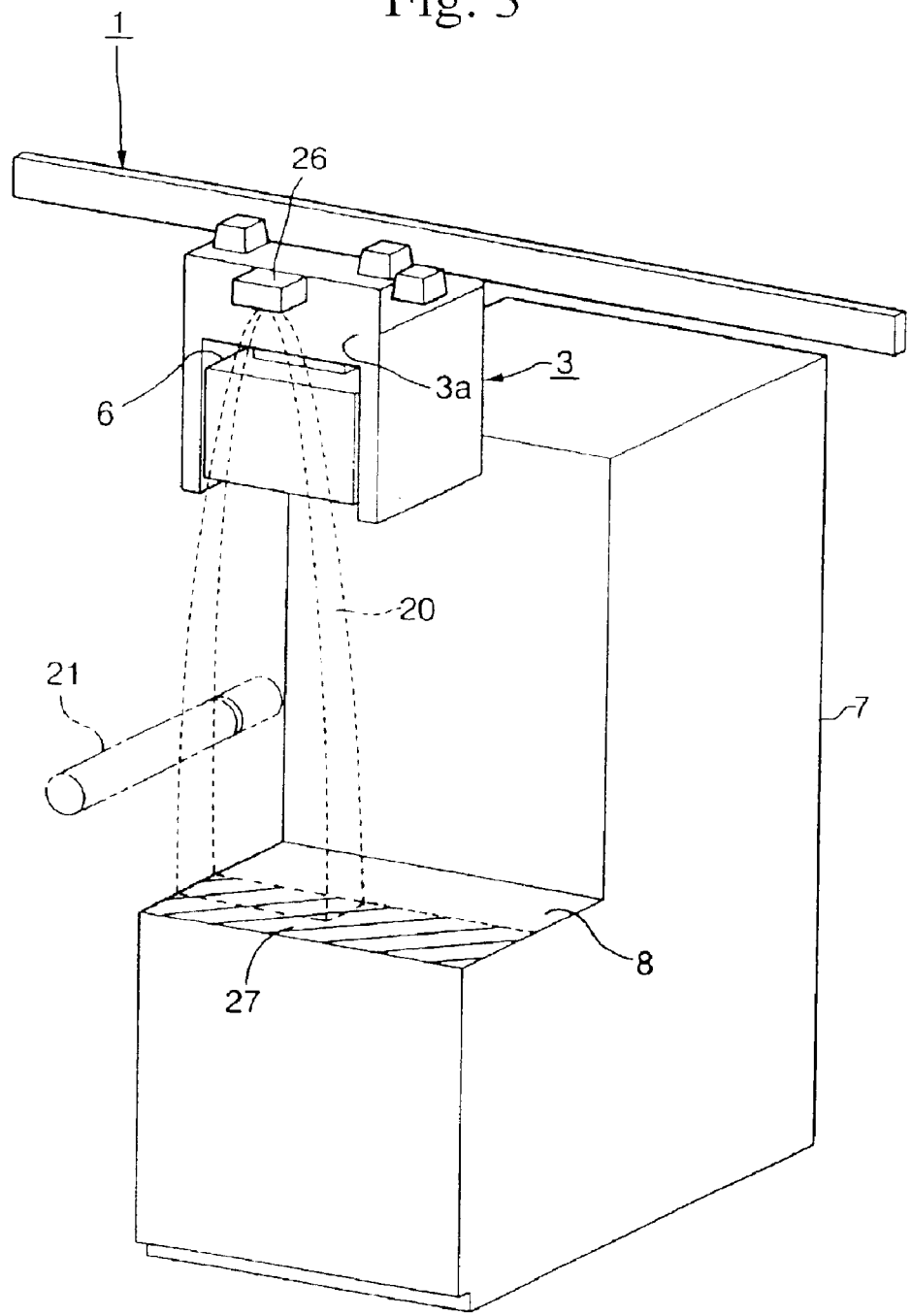
FIG. 3 is a perspective view showing a third embodiment of the overhead-traveling carrying apparatus of the present invention.

Next, a third embodiment of the present invention will explained with reference to FIG. 3. Those structural parts which are identical to those shown in FIG. 1, which depicts the first embodiment, are given identical reference numbers, and an explanation thereof will be omitted here.

In this embodiment, in place of the scanning-type obstacle detecting sensors 22 which were employed in the first embodiment, an obstacle detecting sensor 26, which is capable of forming an observation range 20 so that the light emitting and light collecting ranges have a parabolic outline which is broader toward the bottom as a result of a light source, light collecting elements, or the shape of lenses which are not depicted in the figure, is provided on side wall 3a. This obstacle detecting sensor 26 is a reflecting type which views the amount of light which is reflected, and a matted black surface treatment 27 is executed on the upper surface of the load port 8 so that light is not reflected from the upper surface of the load port 8 so as to cause incorrect functioning.

Operational effects similar to those of the first embodiment may be obtained by this embodiment.

Figure 4:
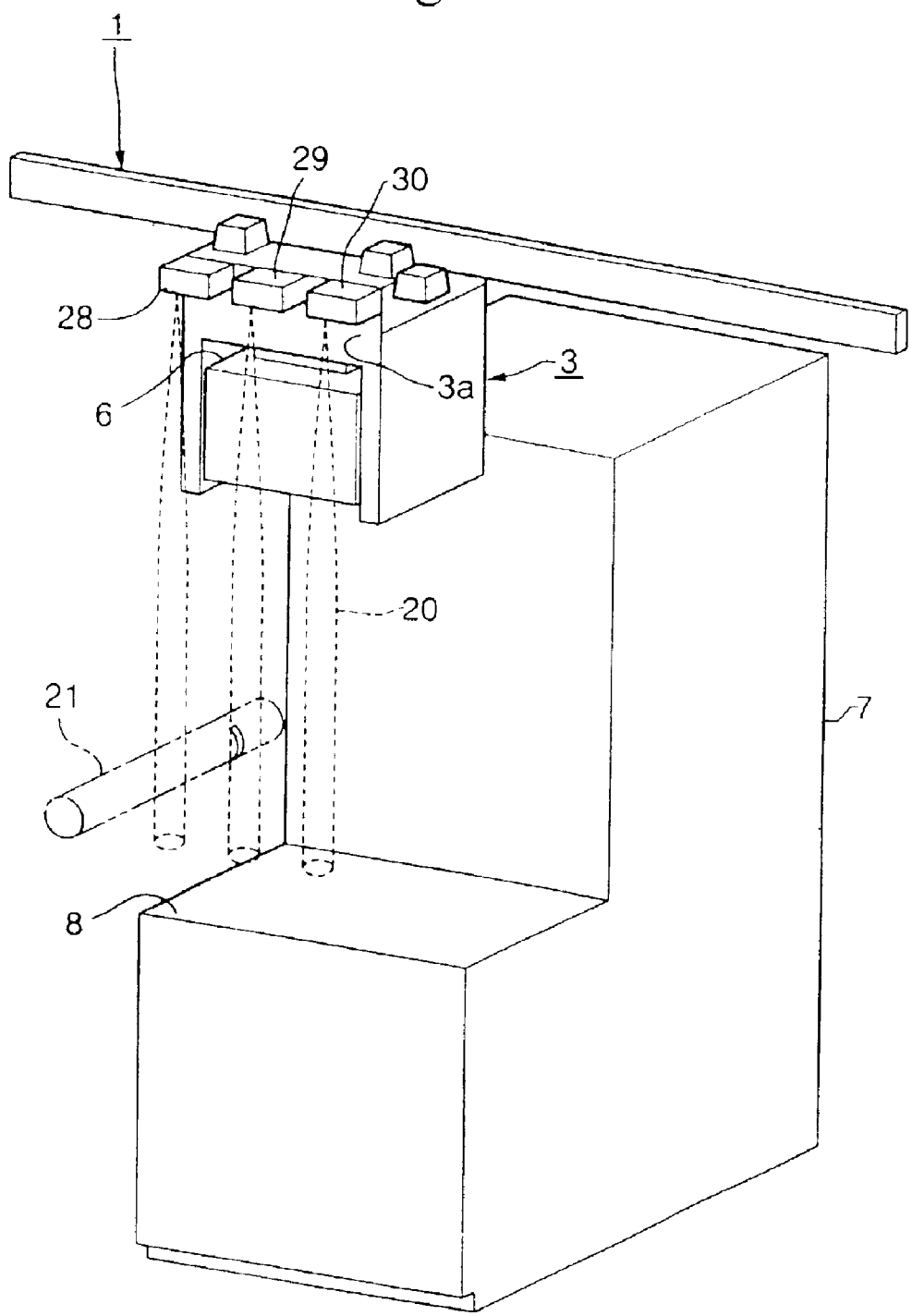
FIG. 4 is a perspective view showing a fourth embodiment of the overhead-traveling carrying apparatus of the present invention.

Next, a fourth embodiment of the present invention will be explained with reference to FIG. 4. Those structural parts which are identical to those in FIG. 1, which depicts a first embodiment, are given identical reference numbers, and an explanation thereof will be omitted here.

In this embodiment, in place of the single scanning-type obstacle detecting sensor 22 which was used in the first embodiment, three range-finding-type obstacle detecting sensors 28, 29, and 30 are provided on side wall 3a. These obstacle detecting sensors 28, 29, and 30 form the observation range 20 by the sum of the various observation areas.

This embodiment is capable of obtaining the same operational effects as the first embodiment.

Next, a fifth embodiment will be explained with reference to FIG. 5. Those structural parts which are identical to those in FIG. 1, which depicts the first embodiment, are given identical reference numbers, and an explanation thereof will be omitted.

In this embodiment, in place of the scanning-type obstacle detecting sensor 22 employed in the first embodiment, a structure is employed in which a reflector surface 41 is provided on the load port 8 of each semiconductor manufacturing apparatus 7, and a regression reflection type obstacle detecting sensor 40, which shines light onto a predetermined detection area 42 on the upper surface of reflector plate 41, and which collects reflected light from the detection area 42, is attached to the side wall 3a of carriage 3 with an attached hoist.

Furthermore, this regression reflection type obstacle detecting sensor 40 is connected to a control mechanism which is not depicted in the Figure. When reflected light is received from the entire surface of the detection area 42 by the obstacle detecting sensor 40, the control mechanism sets the output to ON, and determines that "the presence of the entire surface of reflector plate 41 has been confirmed, so that carrier 6 can move." On the other hand, when reflected light has not been obtained from the entire surface of detection area 42 in obstacle detecting sensor 40 (that is to say, as viewed from the side of obstacle detecting sensor 40, an obstacle 21 is obstructing the detection area 42 at some point, or reflector point 41 is not positioned directly below), the output is set to OFF, and the control mechanism makes the determination that the movement of carrier 6 is impossible.

When the range which is to be detected by the structure of each semiconductor manufacturing apparatus 7 becomes limited, by employing the detection area selection function provided in the obstacle detecting sensor 40, it is possible to restrict the width of the detection area. On the other hand, when it is necessary to broaden the detection area as a result of a large-sized overhead-traveling carrying apparatus or the like, by employing the mutual interference protection function (a switching function of the projected light frequency) provided in obstacle detecting sensor 40, it is possible to cover a broad detection area using a plurality of obstacle detecting sensors 40.

Figure 5:
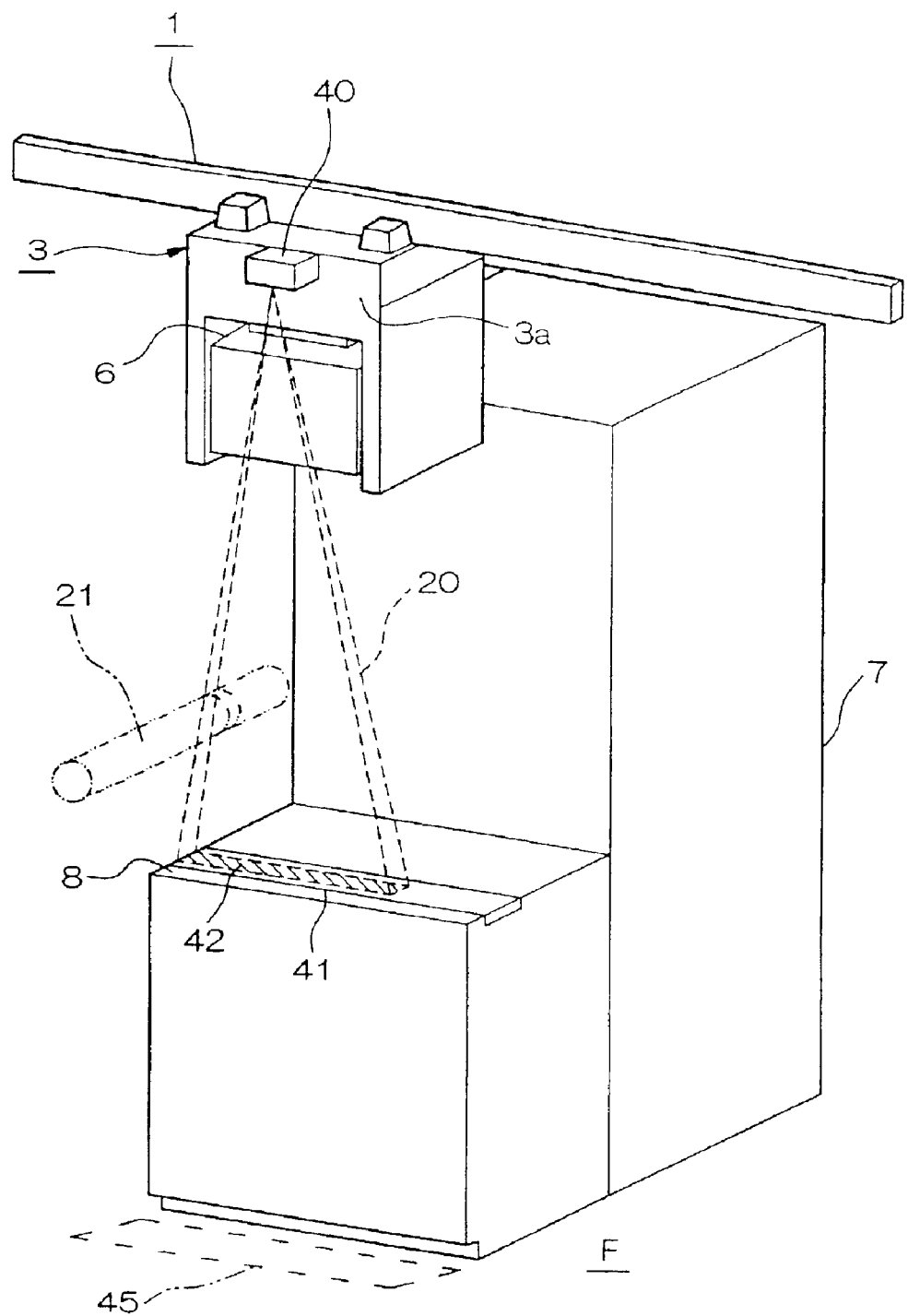
FIG. 5 is a perspective view showing a fifth embodiment of the overhead-traveling carrying apparatus of the present invention.

Furthermore, in the present embodiment, a structure is adopted in which the reflector plate 41 is provided on the load port 8; however, when it is difficult to install this plate on the load port 8, it is also possible to provide the plate on the floor surface F which adjoins the apparatus 7 in front of load port 8 and which is regarded as a plane (the area 45 depicted by the double dotted line in FIG. 5).

Operational effects identical to those of the first embodiment may be obtained using this embodiment as well.

In the first through fifth embodiments of the present invention described above, obstacle detecting sensors 22, 24, 25, 26, 28, 29, 30, and 40 were provided on the side wall 3a of the carriage 3 with attached hoists; however, this is not necessarily so limited, insofar as obstacles 21 within an observation range 20 containing one or both of the movement range during the lowering of the wafer carrier and the vicinity of the movement range may be detected; these sensors may be affixed at other spots, such as the front or back or lower end of the carriage 3 with attached hoist, or a structure may be employed in which a plurality of sensors are installed at different points.

Furthermore, the obstacle detecting sensors 22, 24, 25, 26, 28, 29, 30, and 40 which are shown in the first through fifth embodiments of the present invention only represent examples; these are not necessarily so limited, and other types of optical sensors may be employed.

Furthermore, in the fourth embodiment of the present invention described above, a structure was adopted in which three range-finding-type obstacle detecting sensors 28, 29, and 30 were provided on side wall 3a; however, in place of this, it is also possible to adopt a structure in which sensors similar to the regression reflection type obstacle detecting sensors 40 in the fifth embodiment are provided at a plurality of spots (for example, 3) on side wall 3a, and a similar reflector plate 41 is provided on load port 8 (not depicted in the figure), and in which an observation range 20 is formed by the sum of the observation areas of these obstacle detecting sensors. In this case, as well, it is possible to obtain operating effects which are identical to those of the first embodiment. When it is difficult to install the reflector plate 41 on load port 8, as well, it is possible to provide this on the floor surface F which adjoins the apparatus 7 in front of load port 8 and which is regarded as a plane.

Furthermore, in the fourth embodiment of the present invention described above, three obstacle detecting sensors 28, 29, and 30 were employed; however, this is not necessarily so limited, and a number sufficient to form an observation range having sufficient breadth or size may be employed, so that two or four or more may be employed.

Furthermore, in the first through fifth embodiments described above, an example was explained in which the overhead-traveling carrying apparatus of the present invention was installed in a semiconductor manufacturing facility which conducted the manufacturing of semiconductor devices by processing semiconductor wafers; however, this is not necessarily so limited, and the present invention may be adapted for factory automation lines in factories, or other facilities.

In accordance with the overhead-traveling carrying apparatus of claim 1 of the present invention, by providing a number of obstacle detecting sensors at the side of the carriages with attached hoists which is much smaller than the number of manufacturing apparatuses, it is possible to provide an overhead-traveling carrying apparatus which is capable of inexpensively incorporating countermeasures which detect obstacles such as people or carelessly placed objects prior to those obstacles coming into contact with objects to be carried during the lowering thereof, thereby avoiding such contact.

Furthermore, in accordance with the overhead-traveling carrying apparatus in accordance with a preferred embodiment described above of the present invention, in the setting of the observation range, the optical search range is set in advance in accordance with the height of the various load ports of each manufacturing apparatus, and thereby, it becomes possible to provide an overhead-traveling carrying apparatus which is capable of accommodating all manufacturing apparatuses having load ports of differing heights.

Furthermore, in accordance with the overhead-traveling carrying apparatus of another preferred embodiment of the present invention, effects identical to those obtained in claim 1 may be obtained.

What is claimed is:

1. An overhead-traveling carrying apparatus provided with a track, which is installed overhead of manufacturing apparatuses, and carriages with attached hoists, which travel along the track, wherein said carriages with attached hoists are provided with an obstacle detecting sensor for detecting the presence of obstacles by optically searching a raising and lowering path between a carriage and a load port of each of said manufacturing apparatus, wherein said obstacle detecting sensor is a scannable range-finding sensor comprising a light emitting part and a light collecting part, and said obstacle detecting sensor scans a fan shaped scan range centering on said obstacle detecting sensor, and wherein a range of said optical searching is set in advance in accordance with the height of said load port of each of said manufacturing apparatuses so that said load port is not detected as an obstacle.

* * * * *